United States Patent [19]

Douglas et al.

[11] Patent Number: 4,654,112
[45] Date of Patent: Mar. 31, 1987

[54] OXIDE ETCH

[75] Inventors: Monte A. Douglas; Thomas D. Bonifield, both of Dallas, Tex.

[73] Assignee: Texas Instruments Incorporated, Dallas, Tex.

[21] Appl. No.: 655,004

[22] Filed: Sep. 26, 1984

[51] Int. Cl.[4] .................... B44C 1/22; C03C 15/00; C03C 25/06

[52] U.S. Cl. .................... 156/643; 156/653; 156/657; 156/663; 204/192.32; 252/79.1

[58] Field of Search ............ 156/643, 646, 653, 659.1, 156/657, 661.1, 663; 427/88, 96; 204/192 E; 252/79.1

[56] References Cited

U.S. PATENT DOCUMENTS

| 4,310,380 | 1/1982 | Flamm et al. | 156/643 |
| 4,412,119 | 10/1983 | Komatsu et al. | 156/643 X |
| 4,522,681 | 6/1985 | Gorowitz et al. | 156/643 |
| 4,568,410 | 2/1986 | Thornquist | 156/657 X |

OTHER PUBLICATIONS

"$NF_3$—An Extremely Selective Plasma Etchant . . . ", Air Products, advertisement in Solid State Technology, Feb. 1985.

Donnelly et al., "Anisotropic Etching of $SiO_2$ in . . . $NF_3$/Ar Plasmas", J. Appl. Phys., 55(1), Jan. 1, 1984, pp. 242–252.

Primary Examiner—Michael Wityshyn
Assistant Examiner—Ramon R. Hoch
Attorney, Agent, or Firm—Robert Groover, III; James T. Comfort; Melvin Sharp

[57] ABSTRACT

A new process for plasma etching silicon oxides in integrated circuit structures. A chemistry comprising both oxygen and nitrogen trifluoride is used, with oxygen the dominant component. This provides excellent selectivity to silicon. This etch chemistry also erodes photoresist rapidly, so that it is typically used in combination with a hard-masking process. One particular application of this invention is in a cantilever-etch-mask contact profiling process.

10 Claims, 1 Drawing Figure

OXIDE ETCH

BACKGROUND OF THE INVENTION

The present invention relates to an etch for fabrication of integrated circuits

In particular, the present invention relates to selective etching of silicon oxides in integrated circuit fabrication processes.

It is very frequently necessary to etch silicon oxides preferentially with respect to silicon in integrated circuit fabrication. For example, when a contact is being cut through an interlevel dielectric such as phosphosilicate glass (PSG) or borophosphosilicate glass (BPSG) to a level comprising silicon (e.g. to moat or to polysilicon), the etch must be selective in this respect.

Conventionally, to etch oxide preferentially with respect to silicon, a fluorine deficient plasma is used. Typically a fluorine to carbon atomic ratio of about 2 to 1 is used, together with a small fraction (e.g. 5% or less mole percent) of oxygen. If too much oxygen is used, it scavenges the carbon as carbon monoxide, and etching proceeds in a fluorine-rich regime, wherein both silicon and silicon dioxide are etched. Thus, chemistry such as CHF3 plus O2 could be used, with the CF3 flowed at a rate much larger than that of the O2, according to the prior art.

However, the present invention does not fit the prescription of the prior art at all, since (1) nitrogen trifluoride is used as the primary fluorine source (and preferably no carbon-bearing species is included at all); (2) the atomic composition of the etch gas mixture includes more oxygen than fluorine, and, in the presently preferred embodiment, oxygen is flowed at 10 times the rate of the nitrogen trifluoride. NF3 has been tried in many different plasma etch applications over the years, but no prior art suggests that a gas mixture which is mostly oxygen, with a little NF3 added, will etch oxide preferentially with respect to silicon.

Moreover, the prior art oxide-over-silicon preferential etches have inherent problems with residues. That is, there is always the problem of depositing polymeric residue in exposed areas, and the exact mass flow ratios and process chemistry and conditions must be painstakingly adjusted to get them within the narrow windows required for good selectivity without residue deposition. The oxide etch taught by the present invention does not leave residues, which is a tremendous advantage over the prior art.

This is particularly advantageous in contact etching, where deposition of residues at the bottom of the contact hole will not only degrade the contact resistance, but will introduce greater random variation in this parameter, i.e. will degrade process control.

This is also advantageous in the direct moat isolation processes, wherein the field oxide, instead of being grown in a pattern, is grown (or deposited) everywhere and then etched in a pattern. In this technology the oxide etch which clears the field oxide will contact the naked surface of the moat, so that any residue deposition may cause gate oxide defects.

Thus it is an object of the present invention to provide an etchant for etching silicon oxides preferentially with respect to silicon.

It is a further object of the present invention to provide an etchant, for etching silicon oxides preferentially with respect to silicon, which does not deposit residues.

Thus it is an object of the present invention to provide an etchant for etching silicon oxides preferentially with respect to metal silicides.

It is a further object of the present invention to provide an etchant, for etching silicon oxides preferentially with respect to silicides, which does not deposit residues.

The nitrogen trifluoride plus oxygen chemistry turns out to have surprising advantages. In particular, it provides astonishing selectivity of oxide over silicon, contrary to the teachings of the prior art. See, for example: Donnelly, V. M., Flamm, D. L., Dautremont-Smith, W. C., and Werder, D. J., J. Appl. Phys., 55, 242 (1984). For example, this chemistry gives 12 to 1 selectivity to etch phosphosilicate glass preferentially with respect to monocrystalline silicon. It gives 13 to 1 selectivity to etch PSG preferentially with respect to P-type polysilicon. It gives 2.2 to 1 selectivity of plasma oxide over silicon.

Thus, the nitrogen trifluoride plus oxygen chemistry taught by the present invention, which is inherently very resistant to residue deposition, has substantial advantages in this respect.

A notable characteristic of this etch chemistry is that it will attack organic materials, such as photoresist, rapidly. This is disadvantageous in many applications, and requires use of a hardmask process in most applications.

The present invention is most particularly advantageous, as the above selectivities show, when the oxide to be etched is PSG or BPSG.

According to the present invention there is provided:

A process for etching silicon oxides in integrated circuit structures, comprising:

providing a partially fabricated integrated circuit structure having at the surface thereof a dielectric comprising silicon oxides;

partially covering said dielectric with a patterned hardmask;

exposing said integrated circuit structure to a plasma in a gas comprising both oxygen and nitrogen trifluoride, the input gas to said plasma comprising more oxygen than nitrogen trifluoride.

BRIEF DESCRIPTION OF THE DRAWINGS

The present invention will be described with reference to the accompanying drawings in which.

DESCRIPTION OF THE PREFERRED EMBODIMENTS

The present invention will be described with reference to a cantilever-etch-mask process, wherein the oxide etch of the present invention is used to undercut an organic spacer layer under a patterned polysilicon hard mask and also etch a PSG layer under the organic spacer layer, but it will be recognized by those skilled in the art that the present invention can also be applied in the context of a wide variety of other integrated circuit fabrication processes.

Figure 1:
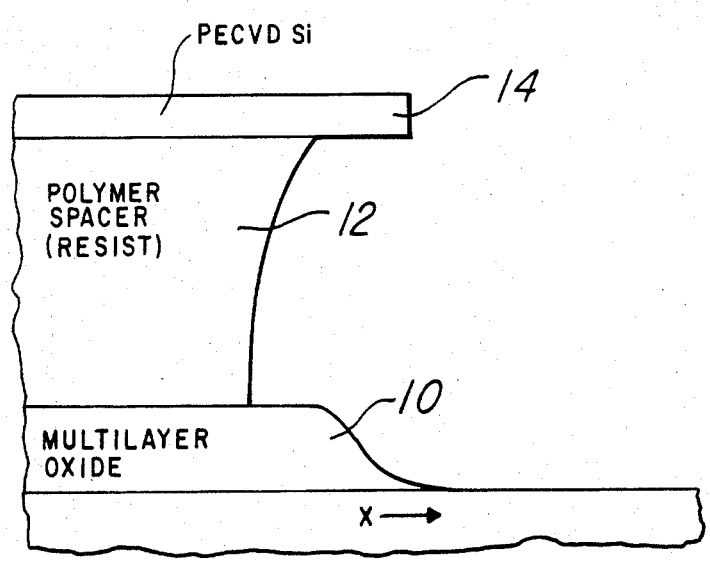
FIG. 1 shows a sample structure where a contact hole is being cut using a cantilever-etch-mask process which uses the process of the present invention.
Figure 2:
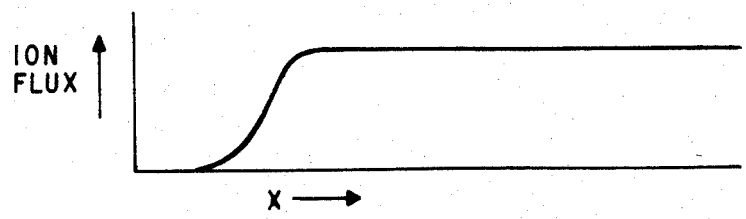

A sample embodiment of the present invention will now be described, where the object is to cut a contact hole in one micron of phosphosilicate glass overlying a 1000 Angstrom thick layer of plasma enhanced CVD oxide. This composite multi-level oxide structure is shown as oxide 10 in FIG. 1.

Next, in the presently preferred embodiment, about 3 microns of AZ 1400-31 resist is spun on and baked at 180 degrees C., to form the spacer layer 12. Next, about 5000 Angstroms of plasma enhanced CVD silicon is deposited atop the spacer layer 12. Next, a top photoresist layer is deposited, exposed, developed, and post baked. (Note that it is preferable to eliminate the hot plate pre-bake step, prior to lithographic processing, lest the spacer resist should "bubble" underneath the PECVD Si layer. This top resist layer can be quite thin, since good planarity will have been provided by the layers 12 and 14. This thin top resist layer can be, for example 6000 Angstroms of a resist such AZ 1400-17.

An anisotropic silicon etch is now used to cut the silicon hard mask layer 14 in accordance with the mask as defined in the top photoresist layer. The etch used at this step can be any conventional etch, such as, for example, one incorporating freon-12 chemistry.

Next, the key etching step of the present invention begins. In the sample embodiment, the slices are now placed in a reactive ion etch reactor. For example, an AME 8110 reactor is used, with power applied at 1000 watts at 13.56 megahertz. The gas mixture flowed includes oxygen at 100 SCCM and nitrogen trifluoride at 10 SCCM, for a total pressure of 100 microns (i.e. 100 milliTorr). The etching temperature is cooled to preferably a little cooler than ambient, e.g. 15 C. This cooling is not critical, but does assist in miminizes gross outgassing from the resist.

This power density in an AME 8110 reactor translates to approximately 150 milliwatts per square centimeter. An alternative way of figuring power densities so as to transfer processes among different reactors is power per unit volume, and the volume of the amp 8110 reactor is approximately 150 liters, so that the power per volume in the plasma is roughly 6½ watts per liter.

As will be noted, this is a somewhat low pressure etching regime. Moreover, the anode and cathode areas are unequal, so that this reactor is operated in what is commonly known as the RIE (reactive ion etching mode) regime.

This etch is performed as a timed etch, e.g. for 75 minutes to process 24 slices in the above configuration. End point detection is not possible, since the area fraction of silicon exposed by the etch is such a small fraction of the total area, and since the silicon hard mask is exposed to the plasma in any case. This etch is preferably performed to achieve 30 percent over etch of the contact hole in the multi-layer 10. However, although this etch is merely a timed etch and not an end point-detecting etch, the timing has been found to be relatively insensitive.

In a further test of the present invention, contact holes were etched simultaneously to moat (i.e. to the silicon substrate) and to an upper polysilicon layer, so that the upper polysilicon contact area was covered by approximately one micron less resist than was the moat area. The etch was timed to etch the moat area optimally, so that the polysilicon contact was greatly over etched. However, no difference in the contact size was visible.

The presently preferred embodiment uses a total pressure of 100 microns, but this can be widely varied, over a range of at least 30 microns to 500 microns, or even more widely. The total pressure will typically be chosen to accomodate the anisotropy requirements of the particular process in which the present invention is incorporated. The present invention will provide adequate anisotropy for many processes.

If an excessive amount of nitrogen trifluoride is used, the silicon hard mask 14 will be etched, or at least pitted. Alternatively, if no nitrogen trifluoride is used, adequate MLO etching cannot be achieved: a pure oxygen plasma will not cut oxide rapidly. Thus, the preferred range of nitrogen trifluoride admixture in the etching recipe is at least 2 SCCM, but must be less than the flow rate of oxygen used.

The nitrogen trifluoride not only provides a fluorine source for anisotropic oxide etching, but also appears to assist in removal of residues. For example, in the foregoing cantilever-etch-mask embodiment, where the organic spacer layer provides a carbon source, residues will be deposited if the nitrogen trifluoride is reduced to zero, but will not be deposited if even a few sccm of NF3 are flowed. Thus, although the presently preferred embodiment uses NF3 as the sole fluorine-bearing species, other embodiments may also include admixtures of fluorocarbon species or other fluorine-bearing species, as long as NF3 is present and the atomic fraction of oxygen in the whole mixture is greater than that of fluorine (and preferably at least four times greater than that of fluorine).

The preferred flow of oxygen is 100 SCCM, but this can be in the range of 10 to 1000 SCCM. However, oxygen flow rates in the range of 30 to 200 SCCM are particularly preferred.

The area power density is preferably 0.15 watts per square centimeter, but may be varied as much as a order of magnitude or more each way, as long as sufficient cooling power is provided.

The nitrogen trifluoride plus oxygen chemistry turns out to have surprising advantages. In particular, it provides astonishing selectivity of oxide over silicon, contrary to the teachings of the prior art. See, for example: Donnelly, V. M., Flamm, D. L., Dautremont-Smith, W. C., and Werder, D. J., J. Appl. Phys., 55, 242 (1984). For example, this chemistry gives 12 to 1 selectivity to etch phosphosilicate glass preferentially with respect to monocrystalline silicon. It gives 13 to 1 selectivity to etch PSG preferentially with respect to P-type polysilicon. It gives about 11 to 1 selectivity of PSG over undoped polysilicon. It also gives 5.6 to 1 selectivity of PSG over plasma oxide. Thus, the present invention is particularly advantageous for etching PSG or BPSG selectively with respect to silicon-bearing materials (crystalline silicon, or polysilicon, or metal silicides).

A notable characteristic of this etch chemistry is that it will attack organic materials, such as photoresist, rapidly. This is disadvantageous in many applications, and requires use of a hardmask process in most applications. However, this very characteristic is advantageous for etching sloped oxide profiles utilizing the cantilever lithographic concept.

In particular, a polysilicon hardmask is process-compatible with many processes, and the most preferred embodiments of the invention use a polysilicon hardmask.

Even more specifically, such a polysilicon hardmask is preferably combined with a planarizing layer underlying it, as in the principal preferred embodiment discussed above.

The composition of the spacer layer 12 can be selected from a wide variety of planarizing polymers. However, it should be noted that poly(methyl methacrylate) is not very suitable for this layer. Novolac-type photoresist is much more suitable. In general, it is believed that photoresist comprising stable aromatic groups, which AZ does and which PMMA does not have, are more suitable.

Thus, the present invention provides a new class of chemistries for etching silicon oxides preferentially with respect to silicon or silicides.

As will be obvious to those skilled in the art, the present invention can be widely modified and varied, and is not limited except as specified in the accompanying claims.

What is claimed is:

1. A process for etching silicon oxides in integrated circuit structures, comprising the steps of:
    providing a partially fabricated integrated circuit structure having at the surface thereof a dielectric comprising silicon oxides;
    partially covering said dielectric with a patterned hardmask; and
    exposing said integrated circuit structure to a plasma in a gas comprising both oxygen and nitrogen trifluoride, the input gas to said plasma comprising more oxygen than nitrogen trifluoride.

2. The process of claim 1, wherein said plasma is generated in a gas having a total pressure in a range between 30 microns and 500 microns.

3. The process of claim 1, wherein said plasma includes more than four times as much oxygen as nitrogen trifluoride.

4. The process of claim 1, wherein said plasma generation step comprises applying power at an area density in the range between 1 and 0.05 watts per square centimeter.

5. The process of claim 1, wherein said plasma generating step comprises applying power at a volumetric density between 1 and 10 watts per liter into said gas mixture in the vicinity of said partially fabricated integrated within a reactor chamber.

6. The process of claim 1, wherein said hardmask consists essentially of polysilicon.

7. The process of claim 1, wherein said dielectric consists essentially of phosphosilicate glass.

8. The process of claim 1, wherein said hard mask layer comprises silicon.

9. The process of claim 1, wherein said dielectric comprises borophosphosilicate glass.

10. A process for fabricating contacts in integrated circuits, comprising the steps of:
    providing a partially fabricated integrated circuit structure having at the surface thereof a dielectric comprising silicon oxides;
    depositing a hard mask layer comprising silicon over said dielectric;
    etching said hard mask layer in a predetermined pattern to cut holes in said hard mask layer at predetermined contact locations;
    exposing said integrated circuit structure to a plasma in a gas comprising both oxygen and nitrogen trifluoride, said gas comprising more oxygen than nitrogen trifluoride, to open contact holes in said dielectric;
    and depositing a patterned conductor to interconnect said contact holes in a predetermined circuit configuration.

* * * * *